United States Patent
Nakayama et al.

(10) Patent No.: US 7,949,080 B2
(45) Date of Patent: May 24, 2011

(54) PHASE ADJUSTING FUNCTION EVALUATING METHOD, TRANSMISSION MARGIN MEASURING METHOD, INFORMATION PROCESSING APPARATUS AND COMPUTER READABLE INFORMATION RECORDING MEDIUM

(75) Inventors: Hiroshi Nakayama, Kawasaki (JP); Hidekazu Osano, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 782 days.

(21) Appl. No.: 11/987,282

(22) Filed: Nov. 28, 2007

(65) Prior Publication Data
US 2008/0175343 A1 Jul. 24, 2008

(30) Foreign Application Priority Data
Jan. 24, 2007 (JP) ................................ 2007-014224

(51) Int. Cl.
*H03D 3/24* (2006.01)
(52) U.S. Cl. ........ 375/373; 375/371; 375/376; 713/400; 713/401; 713/500; 713/503; 713/600; 327/141; 327/144; 327/155; 327/162; 327/156

(58) Field of Classification Search .................. 375/373, 375/371, 375, 376; 713/400, 401, 500, 503, 713/600; 327/141, 144, 155, 162, 156
See application file for complete search history.

(56) References Cited

U.S. PATENT DOCUMENTS

| 4,009,490 A | 2/1977 | Fassbender |
| 2002/0083359 A1 | 6/2002 | Dow |
| 2002/0196883 A1 | 12/2002 | Best et al. |
| 2003/0005250 A1 | 1/2003 | Johnson et al. |
| 2008/0159459 A1* | 7/2008 | Chan et al. .................. 375/371 |

FOREIGN PATENT DOCUMENTS

| JP | 61-292278 | 12/1986 |
| JP | 7-283819 | 10/1995 |
| JP | 2541186 | 7/1996 |

OTHER PUBLICATIONS

Extended European Search Report issued in corresponding European Patent Application No. 07121634.5 on Mar. 12, 2008.

* cited by examiner

*Primary Examiner* — Phuong Phu
(74) *Attorney, Agent, or Firm* — Fujitsu Patent Center

(57) ABSTRACT

A phase amount added to a clock signal or a plurality of data signals for adjusting a phase relationship therebetween in a reception apparatus is changed, and, a result of the phase adjusting operation is stored when the phase amount added to the clock signal or the plurality of data signals is changed.

12 Claims, 15 Drawing Sheets

FIG.10
(a) TAP2 SETTING
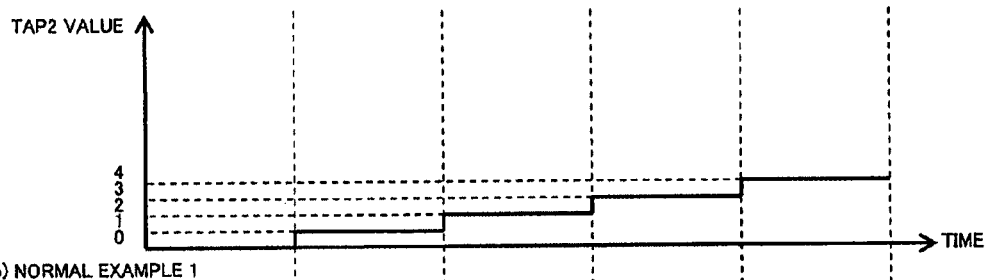
(b) NORMAL EXAMPLE 1
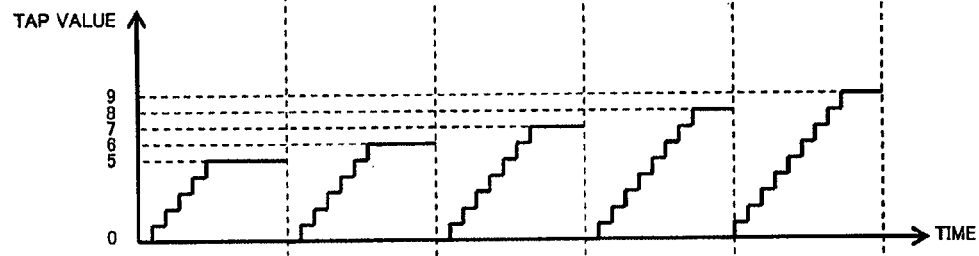
(c) NORMAL EXAMPLE 2
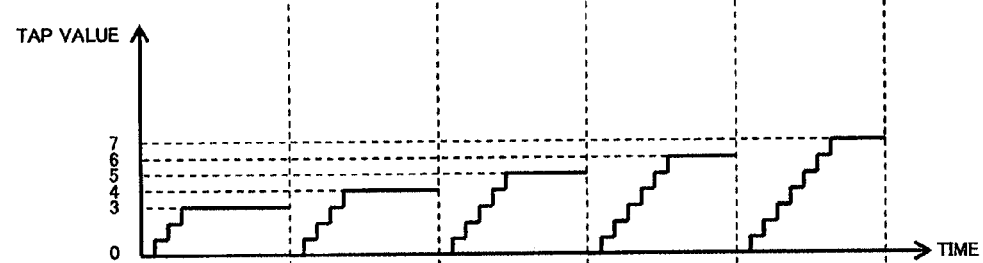
(d) TROUBLE EXAMPLE
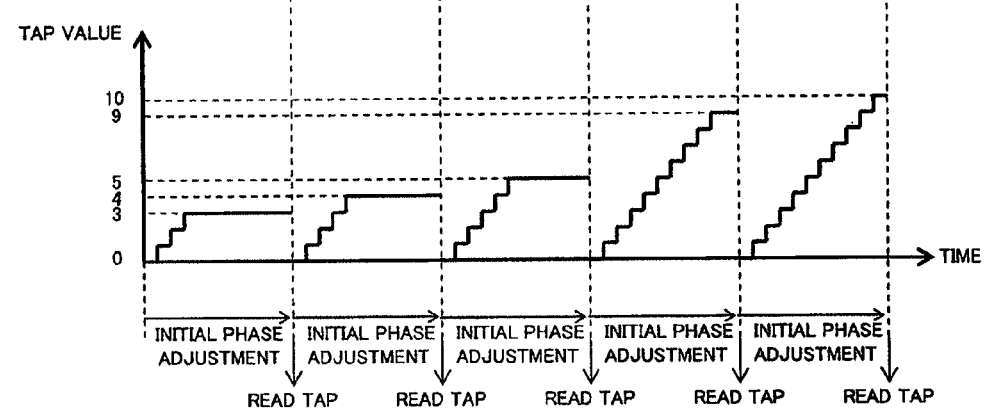

FIG.11

| TAP2 SETTING | TAP READ VALUE | | |
| --- | --- | --- | --- |
| | NORMAL EXAMPLE 1 | NORMAL EXAMPLE 2 | TROUBLE EXAMPLE |
| 0 | 5 | 3 | 3 |
| 1 | 6 | 4 | 4 |
| 2 +1 | 7 +1 | 5 +1 | 5 +4 |
| 3 | 8 | 6 | 9 |
| 4 | 9 | 7 | 10 |

FIG.14

| TAP2 SETTING | PATTERN DETECTION FLAG READ RESULT | DETERMINATION |
|---|---|---|
| 0 | × | OUTSIDE TRANSMISSION WINDOW |
| 1 | × | OUTSIDE TRANSMISSION WINDOW |
| 2 | ○ | WITHIN TRANSMISSION WINDOW |
| 3 | ○ | WITHIN TRANSMISSION WINDOW |
| 4 | ○ | WITHIN TRANSMISSION WINDOW |
| 5 | ○ | WITHIN TRANSMISSION WINDOW |
| 6 | ○ | WITHIN TRANSMISSION WINDOW |
| 7 | × | OUTSIDE TRANSMISSION WINDOW |
| 8 | × | OUTSIDE TRANSMISSION WINDOW |

PHASE ADJUSTING FUNCTION EVALUATING METHOD, TRANSMISSION MARGIN MEASURING METHOD, INFORMATION PROCESSING APPARATUS AND COMPUTER READABLE INFORMATION RECORDING MEDIUM

BACKGROUND OF THE INVENTION

1. Field of the Invention

The present invention relates to a phase adjusting function evaluating method, a transmission margin measuring method, an information processing apparatus, a program and a computer readable information recording medium.

2. Description of the Related Art

FIG. 1 shows a block diagram illustrating a configuration of a transmission chip and a reception chip in one example of the related art.

These transmission chip 100 and reception chip 200' are silicon chips configuring a semiconductor integrated circuit applied to, for example, a part of a computer system, described later with reference to FIG. 5, which part carries out data transmission between a system board 1-$i$ and a memory system interconnect 3, or between the memory system interconnect 3 and an IO unit 2-$i$.

The transmission chip 100 includes a phase synchronization circuit (PLL) 110, a clock output circuit 115, data output circuits 141-1 through 141-$n$ (which may be typically referred to as 141-$i$), data selecting circuits 121-1 through 121-$n$ (which may be typically referred to as 121-$i$).

The data selecting circuit 121-$i$ selects one of regular data and a training pattern, and provides the selected one to the data output circuit 141-$i$.

The training pattern is a data sequence predetermined between the transmission chip 100 and the reception chip 200', and is used for initial phase adjustment operation, which will be described later.

The reception chip 200' includes a clock input circuit 210, data input circuits 221-1 through 221-$n$ (which may be typically referred to as 221-$i$), phase adjusting circuits 231'-1 through 231'-$n$ (which may be typically referred to as 231'-$i$), flip-flop circuits 241-1 through 241-$n$ (which may be typically referred to as 241-$i$), and pattern detecting circuits 251-1 through 251-$n$ (which may be typically referred to as 251-$i$).

As shown in FIG. 2, the phase adjusting circuit 231'-$i$ includes a delay line (DL) 30, a phase detecting circuit 20 and a control part 10.

The delay line 30 provides a delay amount to an input clock signal, which delay amount is determined by a pointer (TAP value) stored in a register of the control part 10. As a result of the delay amount being controlled by means of the TAP value, a phase of the input clock signal is controlled accordingly.

The phase detecting part 20 detects a phase relationship between the input clock signal and input data, and directs a control part 10 to increase/decrease the TAP value 11.

The control part 10 thus updates the TAP value 11 according to a directive provided by the phase detecting circuit 20.

As shown in FIG. 3, the pattern detecting circuit 251-$i$ includes a pattern detecting part 90 and a control part 80.

When the pattern detecting circuit 251-$i$ detects the above-mentioned training pattern in the pattern detecting part 90 upon the initial phase attunement operation, it generates a predetermined detection flag 81, and holds it in the control part 80.

Below, phase adjustment operation in the reception chip 200' configured as mentioned above will be described.

In data transmission between the transmission chip 100 and the reception chip 200', in order to ensure a margin (referred to as a transmission margin, hereinafter) in taking data with the clock signal in the flip-flop circuit 241-$i$ in the reception chip 200', input to the flip-flop circuit 241-$i$ should be made in such a timing relationship that a falling edge of the clock signal occurs at the center of the data waveform (see FIG. 4).

Immediately after a power supply is started up, such a phase relationship may occur between the clock signal and the data that proper data transmission may not be achieved. Therefore, the above-mentioned training pattern known to both the transmission chip 100 and the reception chip 200' is used first to establish a proper phase relationship. Phase adjustment operation for establishing the proper phase relationship between the clock signal and the data is called the initial phase adjustment operation.

Upon the initial phase adjustment operation, the data selecting circuit 121-$i$ selects the training pattern, and outputs the same.

In the reception chip 200', the clock signal input via the clock input circuit 210 from the transmission chip 100 and the data of the training pattern input via each data input circuit 221-$i$ are input to the phase detecting part 20 of the phase adjusting circuit 231'-$i$, which determines a phase adjusting direction.

FIG. 4 shows a time chart illustrating the phase adjustment operation carried out by the phase detecting part 20.

With a rising edge of the data shown in FIG. 4 ($a$), an H/L (high/low) level of the clock signal shown in FIG. 4 ($b$) is sampled. When the sampled level is an H level as shown in FIG. 4 ($b$), a phase is adjusted in such a direction that the clock signal is delayed, as shown in FIG. 4 ($c$). On the other hand, when the sampled level is an L level as shown in FIG. 4 ($d$), a phase is adjusted in such a direction that the clock signal is advanced, as shown in FIG. 4 ($e$). For achieving such a specific phase control, the TAP value 11 of the control part 10 is automatically increased or decreased. As a result, as shown in FIG. 4 ($c$) or ($e$), the phase between the data and the clock signal is adjusted in such a manner that a falling edge of the clock signal occurs at the center of the data waveform.

The above-mentioned training pattern has a finite length, and the initial phase adjustment operation is finished when the entire training pattern has been transmitted.

Success or failure of the initial phase adjustment operation is determined with the pattern detection flag 81 held in the control part 80, which pattern detection flag 81 is generated by the pattern detecting part 20 of the pattern detecting circuit 251-$i$.

When the phase adjustment results in success, i.e., the falling edge of the clock signal occurs at the center of the data waveform as described above with reference to FIGS. 4 ($c$) and ($e$), the flip-flop circuit 241-$i$ can properly takes the data with the clock signal, and thus, the training pattern transmitted from the transmission chip 100 can be properly detected by the pattern detecting part 90 of the pattern detecting circuit 251-$i$. In this case, the pattern detecting part 90 generates the pattern detection flag 81, which is then held by the control part 80.

On the other hand, when the proper phase adjustment is not achieved by some cause, the data is not properly taken by the flip-flop circuit 241-$i$, and thus, the training pattern transmitted from the transmission chip 100 is not properly detected by the pattern detecting part 90 of the pattern detecting circuit 251-$i$. In this case, the pattern detecting part 90 does not generate the pattern detection flag 81.

The pattern detection flag 81 thus held in the control part 80 in the case of the proper phase adjustment, is taken by an external controller not shown, by a function of an external firmware 280'. As a result, the external controller recognizes that the initial phase adjustment operation carried out by each phase adjusting circuit 231'-i results in success. On the other hand, no pattern detection flag 81 is held in the control part 80 in the case where the proper phase adjustment cannot be made, and thus, no pattern detection flag 81 is taken by the external controller in this case. As a result, in this case, the external controller recognizes that the initial phase adjustment operation carried out by each phase adjusting circuit 231'-i results in failure.

When some trouble has occur in the delay line 30, the phase detecting part 20 or the control part 10 in the phase adjusting circuit 231'-i, the phase adjusting function of the phase adjusting circuit 231'-i cannot be carried out, and thus, the proper phase adjusting operation cannot be carried out. In such a case, an operation failure may occur depending on a condition of the ambient temperature, a power supply voltage, frequency, interconnect wiring lengths, or such. Therefore, in such a case where the phase adjusting function of the phase adjusting circuit 231'-i cannot be carried out, this fact should be detected to be solved as soon as possible.

Thus, phase adjustment operation carried out by the phase adjusting circuit 231'-i is such that the phase relationship between the data and the clock signal is automatically optimized. In this connection, there may occur a necessity to know the transmission margin when the optimization is made. In this case, a so-called transmission window (described later with reference to FIG. 13) should be measured. In measurement of such a transmission window in the related art, an oscilloscope is used, and a waveform is observed for each signal therewith. Therefore, a considerable time may be required for the measurement for all the signals when the number of signal lines is large.

Japanese Patent No. 2541186, Japanese Laid-Open Patent Application No. 61-292278 and Japanese Laid-Open Patent Application No. 7-283819 disclose related arts.

SUMMARY OF THE INVENTION

The present invention has been devised in consideration of the above-mentioned situation, and an object of the present invention is to provide a configuration such that phase adjustment operation in a phase adjusting circuit can be easily and positively evaluated.

In order to achieve the object, according to the present invention, a phase amount adding part is provided to add a predetermined phase amount to one of a clock signal and each data signal, which is input to each phase adjusting part. The predetermined phase amount thus added to the clock signal or the data signal is changed in a predetermined manner, and, then, information of resulting operation of the phase adjusting part is stored.

Thus, the predetermined phase amount thus added to the clock signal or the data signal is changed in the predetermined manner, then, information of resulting operation of the phase adjusting part is stored, and thereby, it is possible to effectively simulate a change in a phase difference between the input clock signal and the input data signal, which phase difference may occur in regular operation. Thereby, it is possible to easily and positively prove the phase adjusting function of the phase adjusting part.

Thus, according to the present invention, it is possible to easily and positively prove the phase adjusting function of the phase adjusting circuit, and as a result, when some trouble occurs in the phase adjusting function of the phase adjusting circuit, this fact can be positively detected, to be appropriately dealt with. Thus, it is possible to effectively improve reliability in data transmission in a computer system.

BRIEF DESCRIPTION OF THE DRAWINGS

Other objects and further features of the present invention will become more apparent from the following detailed description when read in conjunction with the accompanying drawings:

FIG. 10 is a time chart illustrating an example of the operation to prove operation of the phase adjusting circuit shown in FIG. 9;

FIG. 11 shows a result of analysis for a TAP value taken in the operation shown in FIG. 10;

FIG. 14 shows a result of reading a pattern detection flag taken for each TAP2 value in the transmission margin measurement example shown in FIG. 13.

DETAILED DESCRIPTION OF THE PREFERRED EMBODIMENT

An embodiment of the present invention has a configuration such as to automatically evaluate a phase adjusting function of each of a plurality of phase adjusting circuits, which are controllable by firmware. In this configuration, operation of each of the phase adjusting circuits can be automatically proved, and a transmission margin can be automatically measured. As a result, it is possible to very easily carry out evaluation of the apparatus and analysis of a trouble.

Each of the plurality of phase adjusting circuits can operate separately.

Further, a register which each of the plurality phase adjusting circuits has can be read or written by the firmware during operation of the phase adjusting circuit.

Further, operation of the phase adjusting circuit can be controlled by the firmware, resulting operation is then analyzed, and thus, evaluation of the phase adjusting function of the phase adjuring circuit can be automatically carried out.

Figure 5:
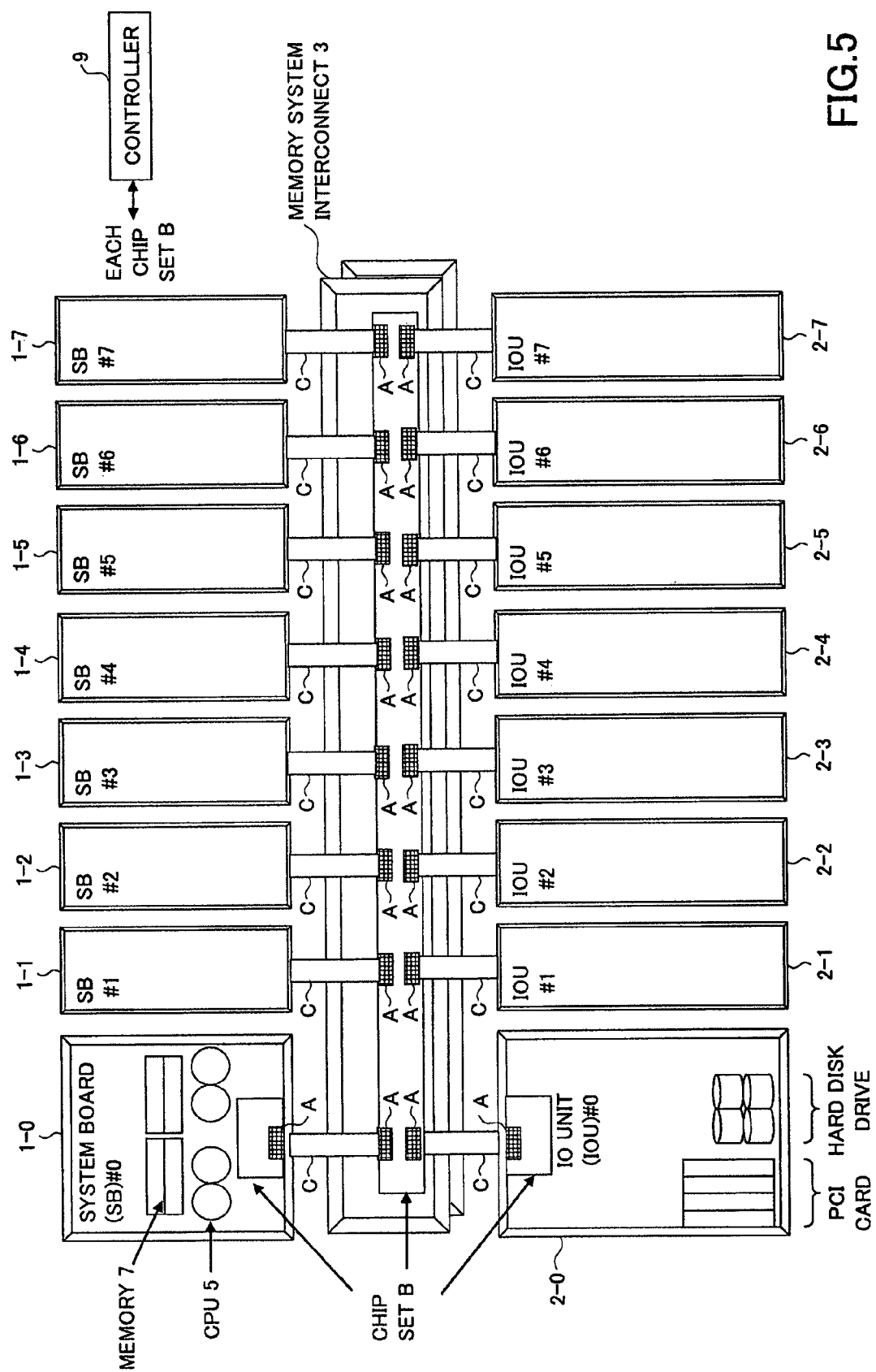
FIG. 5 is a block diagram illustrating a computer system to which a transmission chip and a reception chip in one embodiment of the present invention may be applied.

A configuration of the embodiment of the present invention will be described in detail with reference to figures:

FIG. 5 shows a block diagram showing a configuration of one example of a computer system to which a transmission chip and a reception chip in the embodiment of the present invention may be applied.

As shown in FIG. 5, the computer system includes system boards 1-0 through 1-7 (which may be typically referred to as 1-$i$), IO units 2-0 through 2-7 (which may be typically referred to as 2-$i$), and a memory system interconnect 3.

Each system board 1-$i$ is a board mounting a CPU 5 and a memory 7. Further, each IO unit 2-$i$ is a board mounting an IO device such as a PCI card, a hard disk drive or such.

The memory system interconnect 3 is a board for electrically connecting among the system boards 1-0 trough 1-7 and the IO units 2-0 through 2-7, whereby electric signals are transmitted thereamong.

Each of these boards mounts a control LSI (B) called a chip set. These chip sets B are mutually connected via transmission paths C. Thereby, transmission/reception of data thereamong can be made.

The transmission chip and the reception chip in the embodiment of the present invention may be applied as silicon chips (A in FIG. 5) configuring semiconductor integrated circuit parts providing the above-mentioned functions of transmitting/receiving data.

In this computer system, a controller 9 is provided, the controller 9 is connected to each chip set B, and, with a function of firmware 280 described later, the controller 9 carries out automatic evaluation operation (described later) for a phase adjusting function concerning the above-mentioned data transmission/reception.

Figure 6:
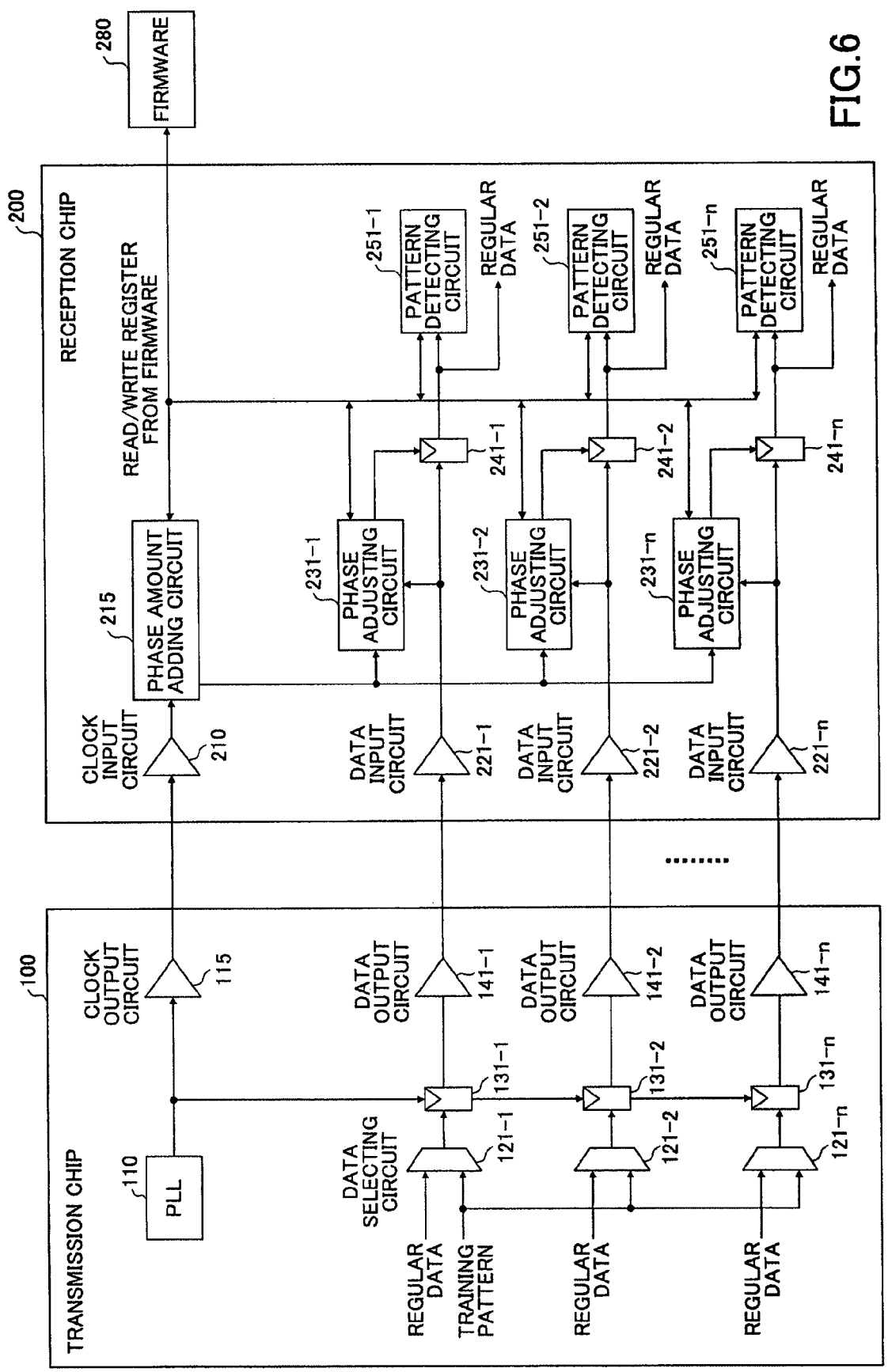
FIG. 6 is a block diagram illustrating a configuration of the transmission chip and the reception chip in the embodiment of the present invention.

FIG. 6 shows a block diagram illustrating configurations of the transmission chip 100 and the reception chip 200 in the embodiment of the present invention.

The transmission chip 100 and the reception chip 200 configure semiconductor integrated circuits applied as functional parts concerning data transmission between the system board 1-$i$ and the memory system interconnect 3, or between the memory system interconnect 3 and the IO unit 2-$i$, in the computer system described above with reference to FIG. 5 for example.

Among the respective ones of the transmission and reception chips 100 and 200, clock lines are used to connect between clock output circuits 115 and clock input circuits 210 included in the respective ones of the transmission and reception chips 100 and 200, while, a data line is used to connect between each data output circuit 141-$i$ and a corresponding data input circuit 221-$i$.

The transmission chip 100 includes a phase synchronization circuit (which may be referred to as a PLL) 110, the above-mentioned clock output circuit 115, the above-mentioned data output circuits 141-1 through 141-$n$ (which may be typically referred to as 141-$i$), flip-flop circuits 131-1 through 131-$i$ (which may be topically referred to as 131-$i$), and data selecting circuits 121-1 through 121-$n$ (which may be typically referred to as 121-$i$).

The PLL 110 generates a clock signal.

The clock output circuit 115 and the data output circuit 141-$i$ include amplifier circuits.

The data selecting circuit 121-$i$ selects any one of regular data given during the computer system operates regularly and the above-mentioned training pattern given upon the above-mentioned initial phase adjustment operation, and provides the thus-selected one to the data output circuit 141-$i$.

The training pattern is a data sequence previously determined between the transmission chip 100 and the reception chip 200.

The reception chip 200 includes the above-mentioned clock input circuit 210, the above-mentioned data input circuits 221-1 through 221-$n$ (which may be typically referred to as 221-$i$), a phase amount adding circuit 215, phase adjusting circuits 231-1 through 231-$n$ (which may be typically referred to as 231-$i$), flip-flop circuits 241-1 through 241-$n$ (which may be typically referred to as 241-$i$), and pattern detecting circuits 251-1 through 251-$n$ (which may be typically referred to as 251-$i$).

The clock input circuit 210 and the data input circuit 221-$i$ include amplifier circuits.

Figure 7:
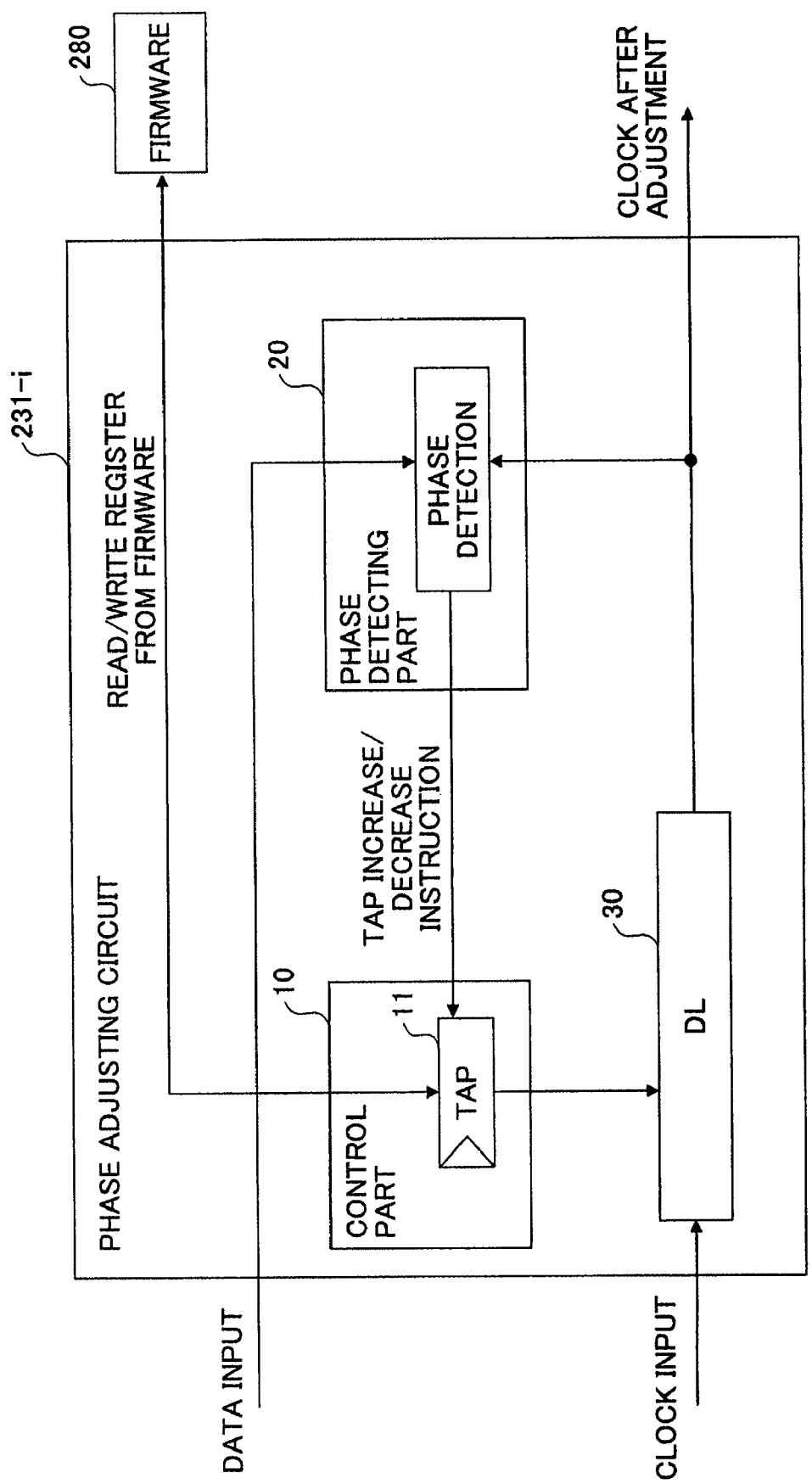
FIG. 7 is a block diagram illustrating a function of a phase adjusting circuit in FIG. 6.

Further, as shown in FIG. 7, the phase adjusting circuit 231-$i$ includes a delay line (DL) 30, a phase detecting circuit 20 and a control part 10.

The delay line 30 has a delay amount determined by a value indicated by a pointer (TAP value 11) stored in a register which the control part 10 has, and controls a phase of an input clock signal by controlling the delay amount given to the input clock signal.

As the delay line 30, a well-known art may be applied. For example, Japanese Patent No. 2541186 discloses a variable delay circuit in which a tap of a delay line with taps is selected and thus, a delay amount thereof is controlled.

The phase detecting circuit 20 detects a phase relationship between the input clock signal and input data signal, and directs the control part 10 to increase/decrease the TAP value 11.

The control part 10 updates the TAP value 11 according to a directive from the phase detecting part 20.

Figure 3:
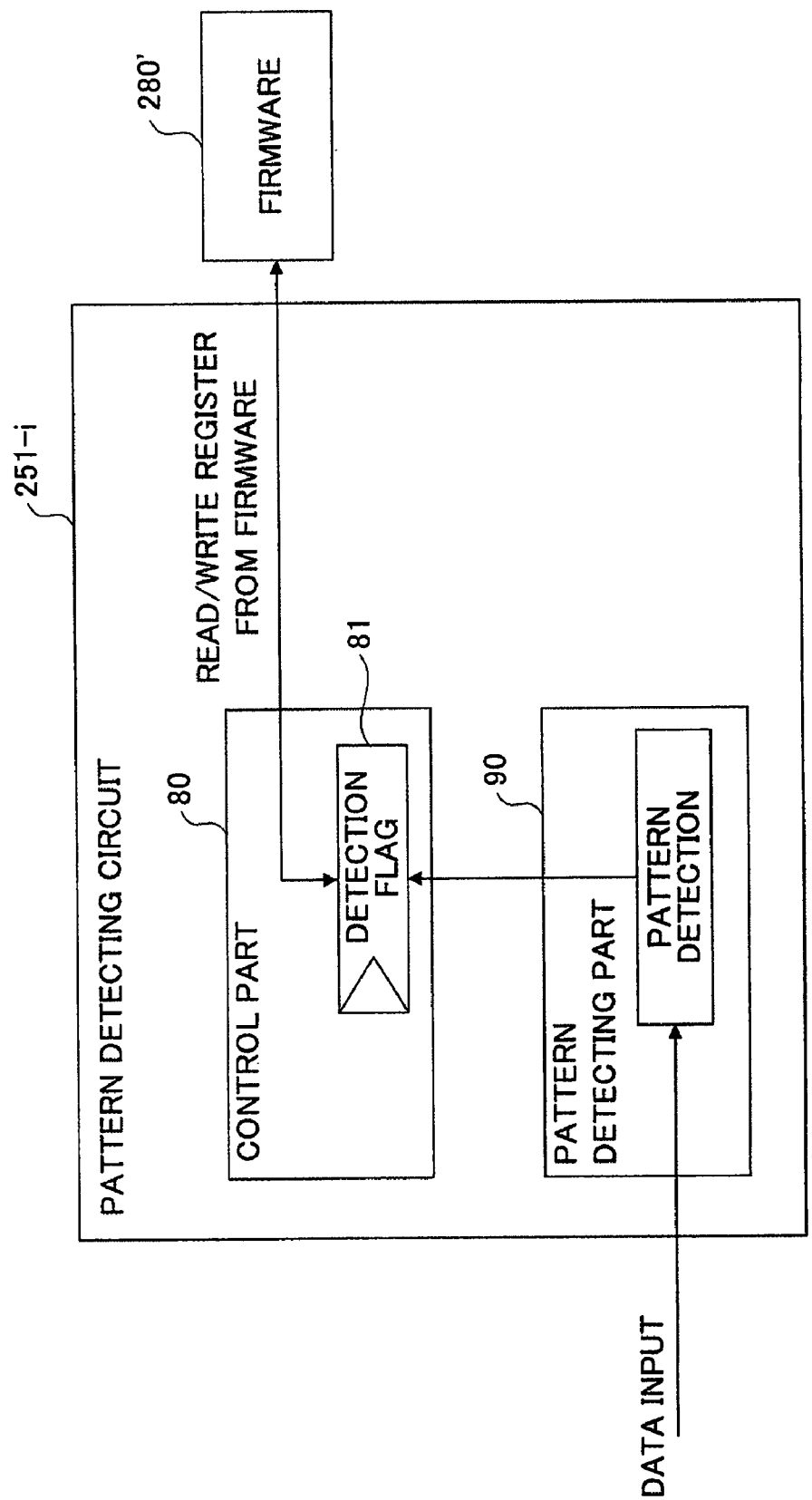
FIG. 3 is a block diagram illustrating a function of a pattern detecting circuit in FIG. 1.

The pattern detecting circuit 251-$i$ includes, as shown in FIG. 3, a pattern detecting part 20 and a control part 80.

When detecting the training pattern in the pattern detecting part 90 upon the initial phase adjustment operation, the pattern detecting circuit 251-$i$ generates the pattern detection flag 81, and holds it in the control part 80.

Figure 1:
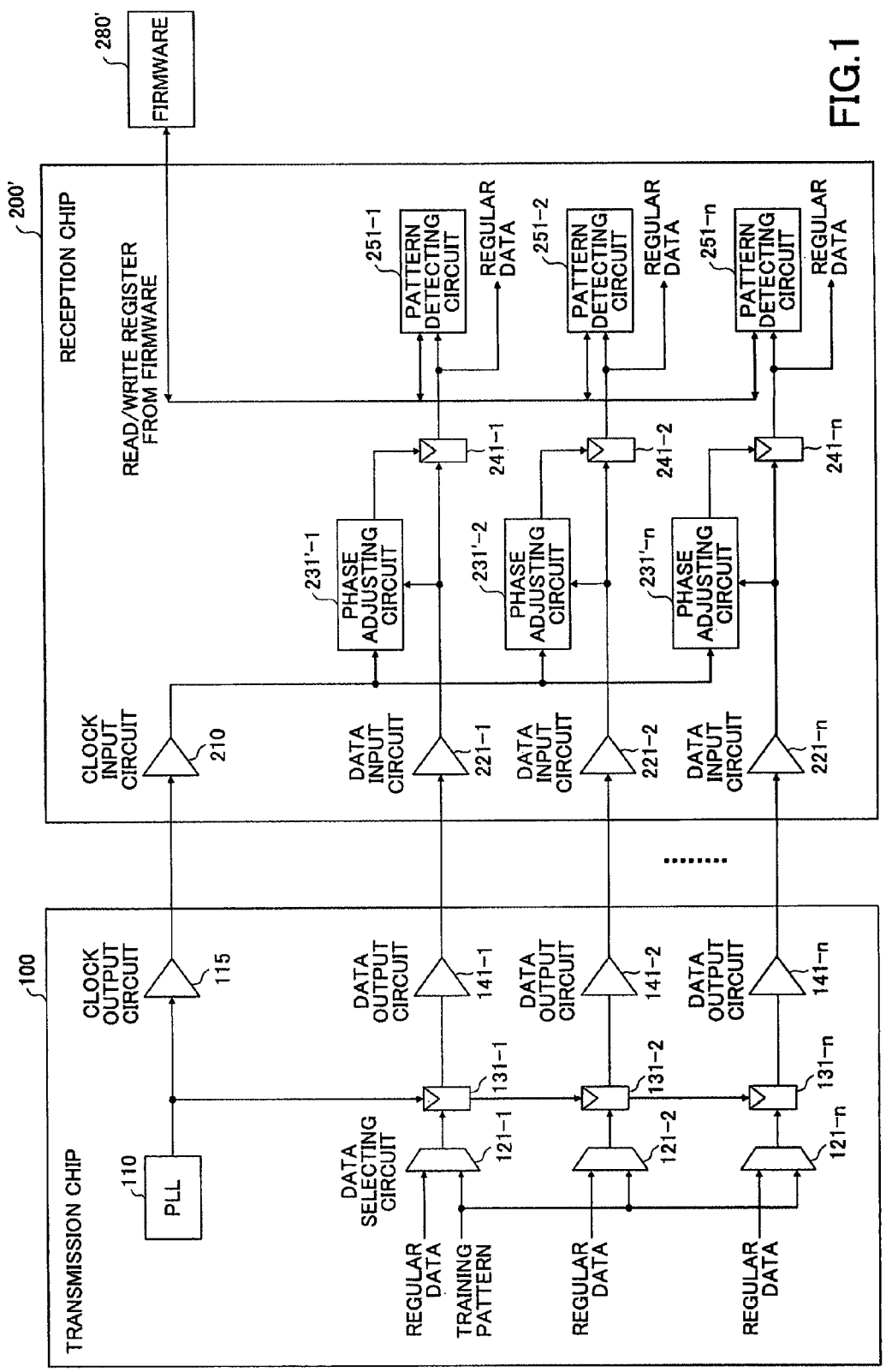
FIG. 1 is a block diagram illustrating a configuration of a transmission chip and a reception chip in one example of the related art.
Figure 2:
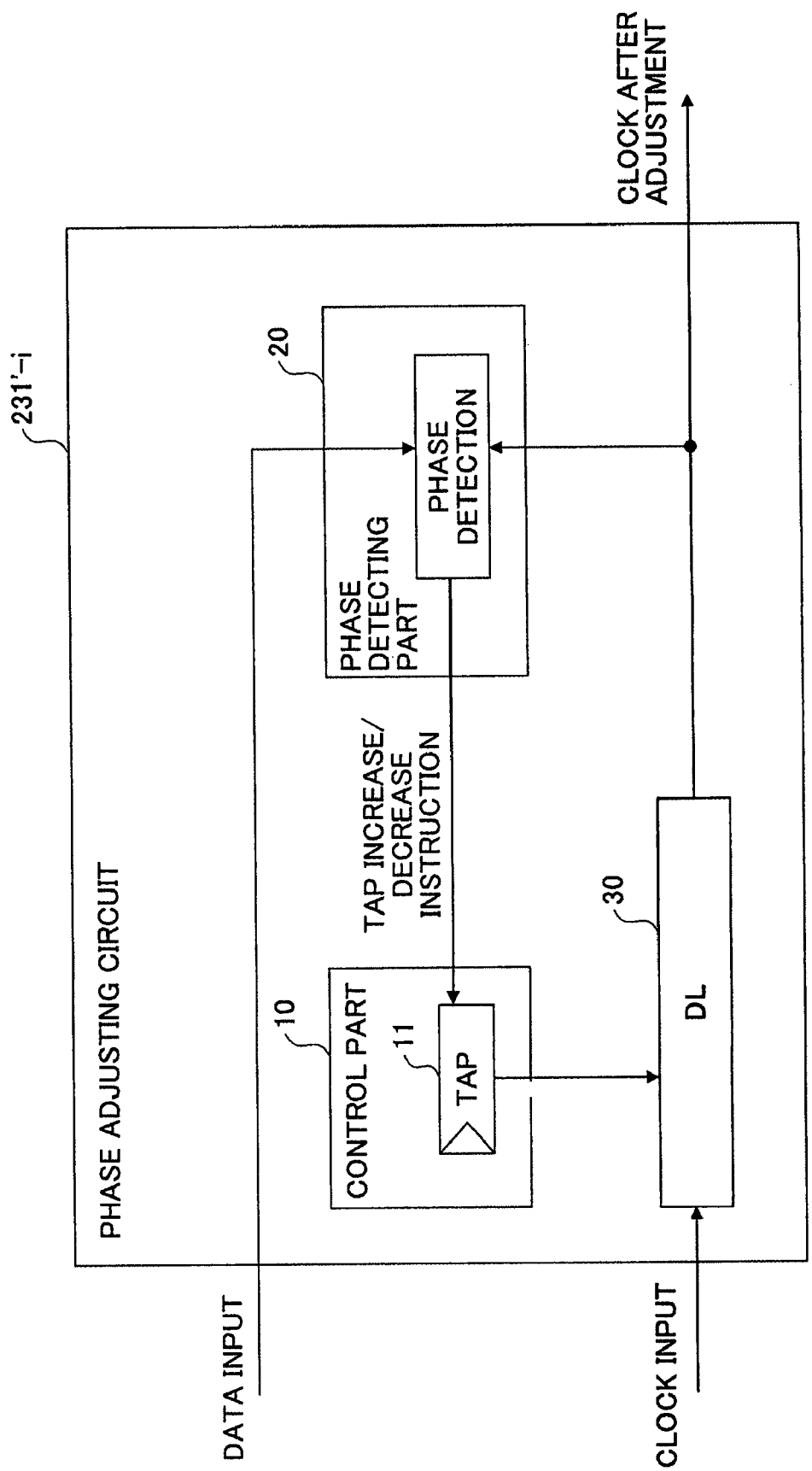
FIG. 2 is a block diagram illustrating a function of a phase adjusting circuit in FIG. 1.

The transmission chip 100 shown in FIG. 6 has the same configuration as that of the transmission chip 100 in the related art described above with reference to FIG. 1.

The reception chip 200 shown in FIG. 6 has the same configuration as that of the reception chip 200' in the related art described above with reference to FIG. 1, except that, in each phase adjusting circuit 231-$i$, the TAP value 11 of the control part 10 is readable/writable by the function of the firmware 280 of the control part 9, and also, the phase amount adding circuit 215 is newly added.

In the configurations shown in FIGS. 6 and 7, the phase relationship between the clock signal and the data signal is controlled as a result of a phase of the clock signal being controlled. However, it is also possible that, the delay line is provided for the data signal, and a phase of the data signal is controlled instead.

In the transmission chip 100, the data selecting circuit 121-I selects regular data or the training pattern, and outputs the selected one, which is then taken by the flip-flop circuit 131-$i$ in timing of the clock signal provided by the PLL 110. The thus-taken signal is then transmitted to the reception chip 200 via the data output circuit 144-$i$. Further, the clock signal is transmitted to the reception chip 200 via the clock output circuit 115, separately.

Further, in the reception chip 200, the phase amount adding circuit 215 add a phase amount to the clock signal received via the clock input circuit 210, and then, the clock signal is provided to each phase adjusting circuit 231-*i*.

The data received via each data input circuit 221-*i* is taken by the flip-flop circuit 241-*i* in timing of the clock signal, a phase of which is adjusted by the phase adjusting circuit 231-*i*, and the thus-taken data is then provided to a subsequent circuit as received data.

Next, phase adjustment operation carried out in the reception chip 200 configured as described above will be described.

Figure 4:
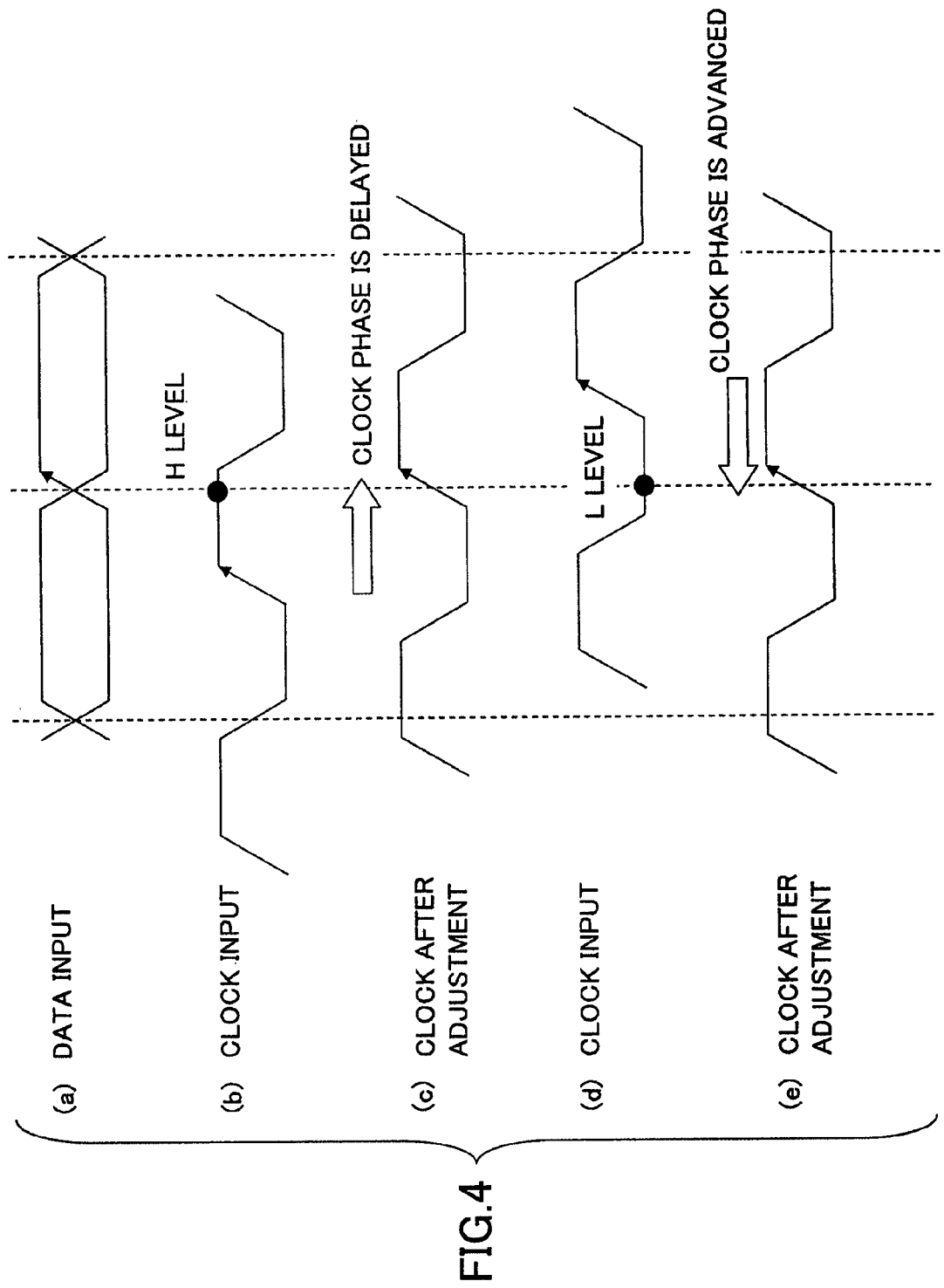
FIG. 4 is a time chart illustrating an example of operation of the phase adjusting circuit of FIG. 1.

In data transmission between the transmission chip 100 and the reception chip 200, in order to ensure a transmission margin upon taking the data in the flip-flop circuit 241-*i* in the reception chip 200 with the clock signal, the clock signal should be input to the flip-flop circuit 241-*i* in such a condition that a falling edge of the clock signal is made occur at the center of the data signal waveform (see FIG. 4).

As mentioned above, immediately after a power supply is started up in the computer system, the phase relationship between the clock signal and the data signal may have an error, and thus, proper data transmission may not be achieved. Therefore, the training pattern is used to previously establish the proper phase relationship between the clock signal and the data signal. This operation is called the initial phase adjustment operation. After the initial phase adjustment operation with the use of the training pattern is properly finished, the regular data is selected by the data selecting circuit 121-*i* in the transmission chip 100, and thus, transmission of the regular data is started between the transmission chip 100 and the reception chip 200.

During the initial phase adjustment operation, the training pattern is selected by the data selecting circuit 121-*i* of the reception chip 100, and the training pattern is output from the data selecting circuit 121-*i*. Further, in the reception chip 100, the clock signal transmitted by the transmission chip 100 and input via the clock input circuit 210 and the phase amount adding circuit 215, and the data signal of the training pattern input via each data input circuit 221-*i* is input to the phase detecting part 20 of the phase adjusting circuit 231-*i*, which then determines a phase adjusting direction.

Phase adjusting operation in the phase detecting part 20 is carried out in the same manner as that described above with reference to FIG. 4, and duplicate description is omitted.

Success/failure in the phase adjustment operation is determined by whether or not the pattern detection flag 81 is held by the control part 80, which flag is generated by the pattern detecting part 90 of the pattern detecting circuit 251-*i*.

As described above with reference to FIG. 4(*c*) and (*e*), when adjustment is carried out such that a falling edge of the clock signal occurs at the center of the data signal waveform, the flip-flop circuit 241-*i* can properly take the data with the clock signal. Therefore, in this case, the training pattern transmitted by the transmission chip 100 can be properly detected by the pattern detecting part 90 of the pattern detecting circuit 251-*i*, and as a result, the pattern detecting part 90 generates the pattern detection flag 81, which is then held by the control part 80.

On the other hand, when proper adjustment cannot be carried out on the phase relationship between the clock signal and the data in the initial phase adjustment operation due to some cause, the flip-flop circuit 241-*i* cannot properly take the data. As a result, the training pattern is not properly detected by the pattern detecting part 90 of the pattern detecting circuit 251-*i*, and thus, the pattern detecting part 90 does not generate the pattern detection flag 81.

The pattern detection flag 81, if any, held by the control part 80, is taken by the controller 9 thanks to the function of the firmware 280 provided in the controller 9. As a result, the controller 9 recognizes whether or not the phase adjustment operation in each phase adjusting circuit 231-*i* during the initial phase adjustment operation has been properly carried out, i.e., the controller 9 recognizes success/failure of the initial phase adjustment operation. That is, when the pattern detection flag 81 is obtained from the register of the control part 80 of the pattern detecting circuit 251-*i*, the firmware 280 of the controller 9 determines that the phase adjustment in the phase adjusting circuit 231-*i* results in success. When the pattern detection flag 81 is not obtained from the register of the control part 80 of the pattern detecting circuit 251-*i*, the firmware 280 of the controller 9 determines that the phase adjustment in the phase adjusting circuit 231-*i* results in failure.

The phase adjustment operation carried out by the phase adjusting circuit 231-*i* is carried out automatically thanks to a control function of the control part 10. When a trouble has occurred in the delay line 30, the phase detecting part 20 or the control part 10 in the phase adjusting circuit 231-*i*, the phase adjusting function of the phase adjusting circuit 253-*i* may be lost, and thus, the proper phase adjustment operation may not be carried out. In such a condition, an operation failure may occur depending on a condition of the ambient temperature, the power supply voltage/frequency, the interconnect wiring lengths, or such. Even in such a case, the actual cause of the operation failure, i.e., the above-mentioned trouble in the delay line 30, the phase detecting part 20 or the control part 10 in the phase adjusting circuit 231-I, may not be easily determined.

Further, the phase adjustment operation is such that, as described above with reference to FIG. 4, the phase relationship between the clock signal and the data signal is optimized automatically. In this connection, the transmission margin of the data signal in the condition in which the optimization is thus made, may be required to know. In this case, a so-called transmission window (described later with reference to FIG. 13) should be measured. In measurement of such a transmission window in the related art, an oscilloscope is used, and a waveform is observed for each signal therewith. Therefore, a considerable time may be required for the measurement for all the signals when the number of signal lines is large.

In order to solve the problems, in the reception chip 200 in the embodiment of the present invention, the phase amount adding circuit 215 is provided separately in addition to the phase adjusting circuit 211-*i*, such that the phase of the input clock signal can be controlled freely.

Figure 8:
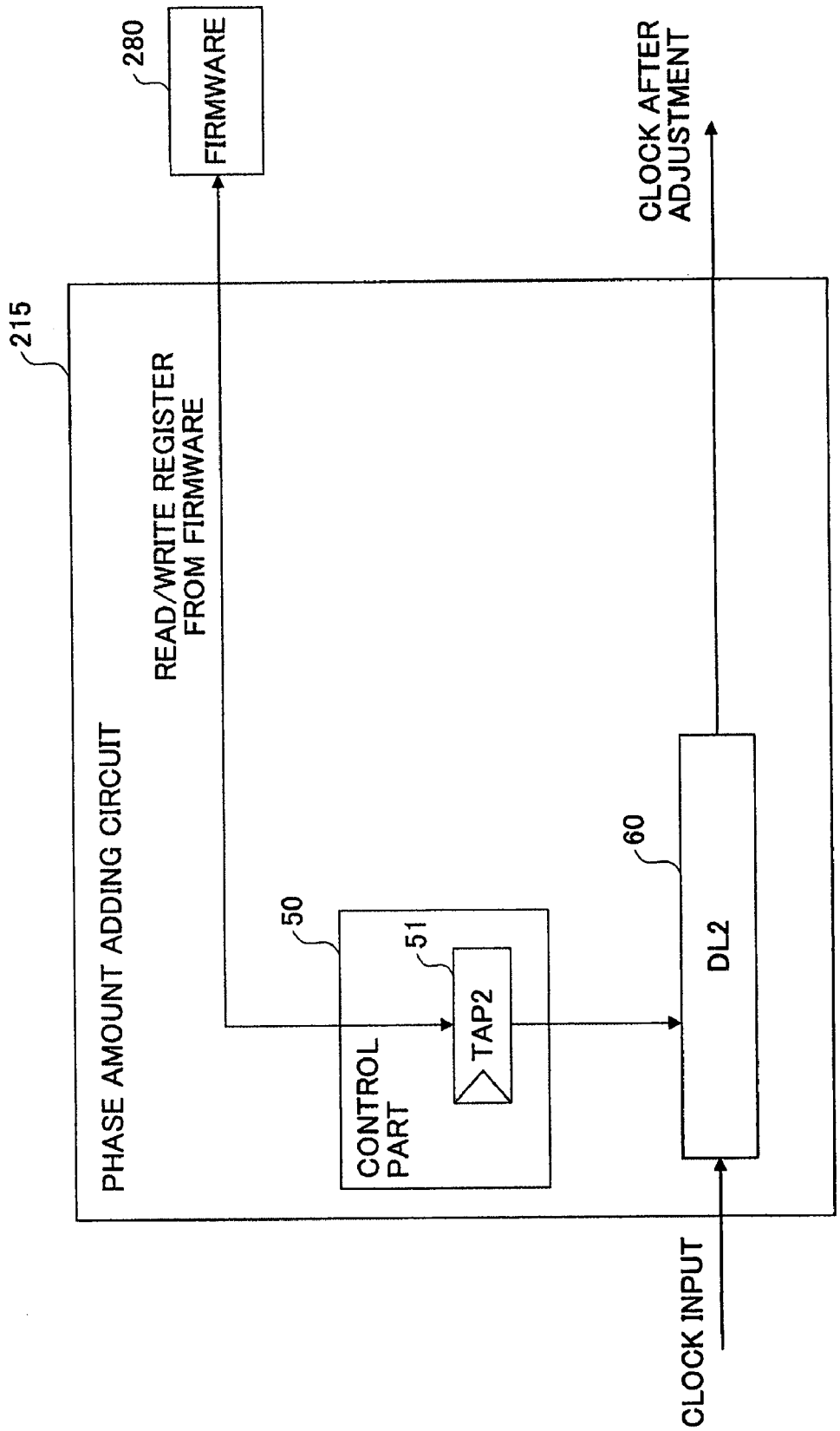
FIG. 8 is a block diagram illustrating a function of a phase amount adding circuit in FIG. 6.

As shown in FIG. 8, the phase amount adding circuit 215 includes a delay line (DL2) 60 and a control part 50, and, the control part 50 stores a TAP2 value 51 in its register.

Further, in the reception chip 200 in the embodiment, as shown in FIGS. 7 and 8, a configuration is provided such that, during operation of the reception chip 200, thanks to a function of the firmware 280 of the controller 9, the stored contents (TAP value 11) of the register of the control part 10 of each phase adjusting circuit 231-*i* and the stored contents (TAP2 value 51) of the register of the control part 50 of the phase amount adding circuit 215, are readable and writable externally.

It is noted that, in the above-described initial phase adjustment operation, a set value in the TAP2 value 51 stored in the register of the control part 50 of the phase amount adding circuit 215 is fixed. Accordingly, during the operation, the delay line (DL2) 60 of the phase amount adding circuit 215 gives a fixed phase amount, i.e., a fixed delay amount, to the input clock signal, and, the clock signal, thus having the fixed phase amount added thereto, is then provided to each phase adjusting circuit 213-i.

In the embodiment, it is assumed that the respective delay lines 30 and 60 of the phase adjusting circuit 231-i and the phase amount adding circuit 215 have the completely identical configurations. Further, a time amount by which the delay amount of the delay line 30 increases each time when the TAP value 11 is incremented by 1 is equal to a time amount by which the delay amount of the delay line 60 increases each time when the TAP2 value 51 is incremented by 1. Similarly, a time amount by which the delay amount of the delay line 30 decreases each time when the TAP value 11 is decremented by 1 is equal to a time amount by which the delay amount of the delay line 60 decreases each time when the TAP2 value 51 is decremented by 1.

Next, operation to proving operation of the phase adjusting circuit 231-i will be described First, thanks to a function of the firmware 280 of the controller 9, the TAP2 value 51 stored in the register of the control part 50 of the phase amount adding part 215 is changed, and in response thereto, the delay amount of the delay line 60 is changed accordingly as mentioned above. Then in this state, the initial phase adjustment operation with the use of the training pattern is carried out.

After the finish of the initial phase adjustment operation, the TAP value 11 stored in the register of the control part 10 of each phase adjusting circuit 231-i is read by the function of the firmware 280 of the controller 9.

As mentioned above, the TAP value 11 determines the delay amount of the delay line 30 of the phase adjusting circuit 231-i, and thus, the TAP value 11 corresponds to the delay amount of the delay line 30. Accordingly, the TAP value 11 obtained after the initial phase adjustment operation indicates information concerning the initial phase adjustment operation, i.e., it indicates the delay amount given to the clock signal for delaying the clock signal in such a manner that a falling edge of the clock signal may occur at the center of the data signal waveform (i.e., the center of the transmission window).

When the TAP2 value 51 stored in the register of the control part 50 of the phase amount adding circuit 215 is changed by the firmware 280 as mentioned above, the phase amount given to the clock signal by the delay line 60 is changed accordingly, and as a result, the phase amount of the clock signal provided to each phase adjusting circuit 231-i is changed.

As a result, in each phase adjusting circuit 231-i, the phase relationship between the input data signal and the clock signal changes. Then, the initial phase adjustment operation is again carried out. In response thereto, thanks to the phase adjusting function of the phase adjusting circuit 231-i described above with reference to FIG. 4, the TAP value 11 is increased/decreased automatically, the delay amount of the delay line 30 is thus adjusted, and thus, such phase adjustment operation is carried out that a falling edge of the clock signal play occur at the center of the data signal waveform as shown in FIGS. 4 (c) and (e).

As a result of the above-described sequence of operation being repeated, a change in the TAP value 11 of the control part 10 of each phase adjusting circuit 231-i, with respect to a change in the TAP2 value 51 of the control part 50 of the phase amount adding circuit 215, is measured each time. As a result, when such a measurement result is obtained that the TAP value 11 increases/decreases in the same way as a given increase/decrease in the TAP2 value 51, it can be determined that the phase adjusting circuit 231-i properly operates. In contract thereto, when such a measurement result is obtained that the TAP value 11 does not increase/decrease in the same way as a given increase/decrease in the TAP2 value 51, it can be determined that the phase adjusting circuit 231-i has a trouble. Further, in the latter case, it is also possible to measure characteristics of the phase adjusting circuit 231-i upon having the trouble, at the same time.

Specifically, the following procedure is carried out by the function of the firmware 280 of the controller 9.

Figure 9:
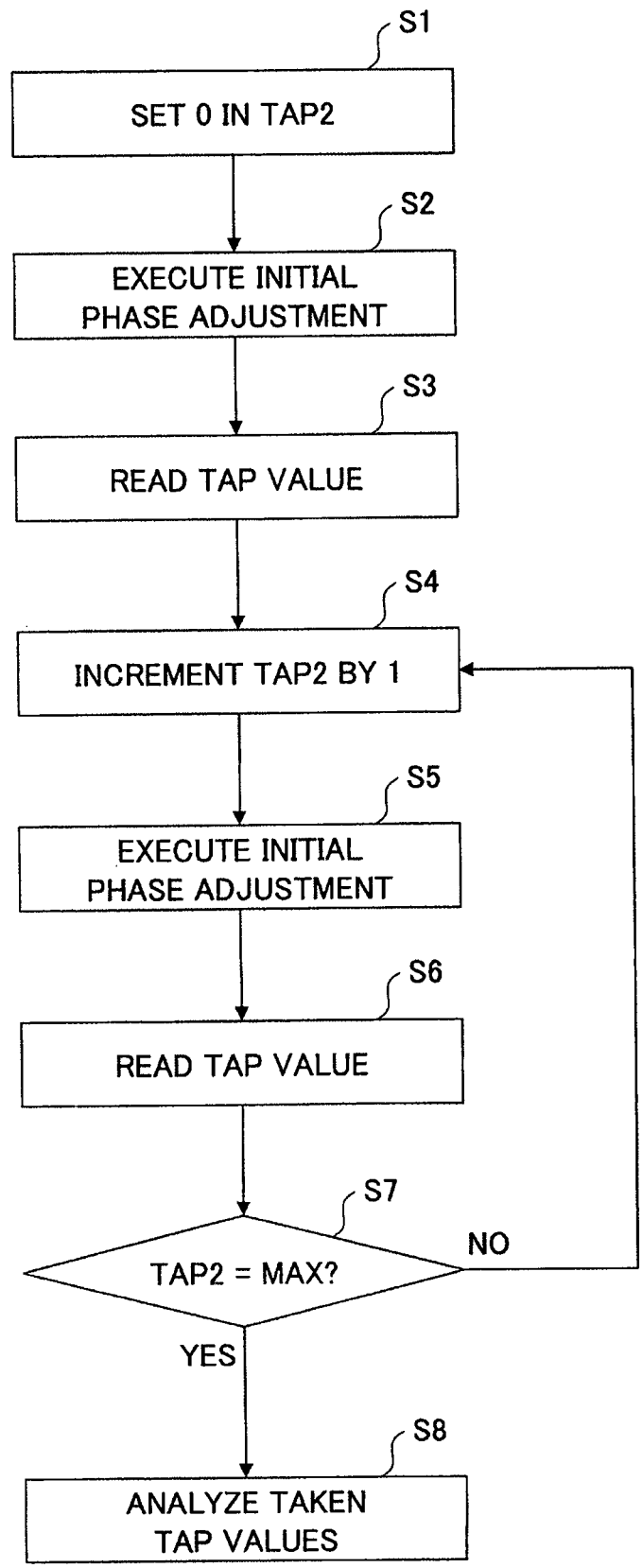
FIG. 9 shows an operation flow chart of operation to prove operation of the phase adjusting circuit.

FIG. 9 shows an operation flow chart illustrating this procedure.

After 0 is set in the TAP2 value 51 in Step S1, the initial phase adjustment operation described above with reference to FIG. 4 is carried out in Step S2.

After that, the TAP value 11 of the control part 10 of each phase adjusting circuit 231-i is read (Step S3), and then, the TAP2 value 51 is incremented by 1 (Step S4). Then, in this state, the initial phase adjustment operation is carried out the same as the above (Step S5).

After that, the TAP value 11 of the control part 10 of each phase adjusting circuit 231-i is read again (Step S6), and after that, a loop operation of Steps S4 through S7 is repeated until the TAP2 value 51 becomes a maximum value (Yes in Step S7).

After the completion thereof, the TAP values 11 thus read in Steps S3 and S6 are analyzed in Step S8).

Next, with reference to FIGS. 10 and 11, operation to prove operation of the phase adjusting circuit 231-i will be described with a specific example.

FIG. 10 (a) shows an example of transition of the TAP2 value 51 along with elapse of time; FIG. 10 (b) shows an example of transition of the TAP value 11 in a case where the phase adjusting circuit 231-i is in a normal state, obtained along with the transition of the TAP2 value 51; FIG. 10 (c) shows another example of transition of the TAP value 11 in a case where the phase adjusting circuit 231-i is in a normal state, obtained along with the transition of the TAP2 value 51; FIG. 10 (d) shows transition of the TAP value 11 in a case where the phase adjusting circuit 231-i is in an abnormal state or has a trouble, obtained along with the transition of the TAP2 value 51.

As shown in FIG. 10 (a), the transition of the TAP2 value 51 along with elapse of time is achieved by the operation of Steps S1 and S4 of the operation flow chart of FIG. 9 described above.

FIG. 11 shows the TAP values 11, which change as shown in FIGS. 10 (b) through (d), read each time thanks to the function of the firmware 280 of the controller 9. The operation of reading the TAP value 11 corresponds to the operation of Steps S3 and S6 of the operation flow chart of FIG. 9 described above.

In this example, as shown in FIG. 10 (a) and FIG. 11, the TAP2 value 51 is changed from 0 through 4 one by one in sequence (Steps S1, S4 of FIG. 9), the initial phase adjustment operation is carried out for each thereof (Steps S2, S5), and the TAP value 11 resulting therefrom is read (Steps S3, S6).

As shown in FIG. 11, in the normal state example 1 shown in FIG. 10 (b), the read TAP value changes as 5, 6, 7, 8, and 9 in the stated order (FIG. 11). Similarly, in the normal state example 2 shown in FIG. 10 (c), the read TAP value changes as 3, 4, 5, 6, and 7 in the stated order (FIG. 11). On the other hand, in the trouble state example shown in FIG. 10(d), the read TAP value changes as 3, 4, 5, 9, and 10 in the stated order (FIG. 11).

As mentioned above, it can be determined that the phase adding circuit 231-*i* operates properly, when the TAP value 11 increases/decreases in the same way as the transition of the TAP2 value 51.

In each of the above-mentioned normal state examples 1 and 2, when the TAP2 value 51 is increased by one by one, the TAP value 11 increases one by one in the same way.

On the other hand, in the above-mentioned trouble state example, when the TAP2 value 51 is increased by 1 from 2 to 3, the TAP value 11 increases by 4 from 5 to 9. Thus, the change amount of the TAP value 11 is +4 with respect to the change amount of the TAP2 value 51 of +1. Thus, it is clear that the TAP value 11 changes more than the change in the TAP2 value 51, thus the TAP value 11 changes not in the same way as the change in the TAP2 value 51, and, it can be determined that a trouble has occurred.

It is noted that the characteristics of the delay line 60 may have variations, and thus, the TAP value 51 may not necessarily change by +1 precisely when the TAP2 values 51 is changed by +1 even when the phase adjusting circuit 231-*i* has no particular trouble. Therefore, it is preferable that a tolerance in some degree may be provided to an actual trouble detecting criterion. For example, such a tolerance may be provided to the actual trouble detecting criterion that, a determination is made as normal even when the TAP value 11 changes by +2 or −2 in response to the TAP2 values being changed by +1 or −1, while, a determination is made as abnormal only when the TAP value 11 changes by +3 or −3 or more in response to the TAP2 values being changed by +1 or −1.

Next, a function of measuring the transmission margin of the data signal in the reception chip 200 will be described.

First, the TAP2 value 51 of the control part 50 of the phase amount adding circuit 215 is set to have a center value, and in this state, the above-mentioned initial phase adjustment operation is carried out. The TAP value 11 of the control part 10 of the phase adjusting circuit 231-*i* obtained at this time is held as an initial value. After that, the TAP value 11 is fixed so that automatic updating thereof is avoided during the initial phase adjustment operation which will be carried out from then. That is, the phase adjusting function of the phase adjusting circuit 213-*i* is deactivated.

Next, the TAP2 value 51 is again changed, the initial phase adjustment operation is then carried out, and the pattern detection flag 81 of the pattern detecting circuit 251-*i* obtained there, if any, is read.

By repeating this sequence of operation, it is possible to obtain results of pattern detection with respect to the change in the TAP2 value 51. From the measurement results of pattern detection, it is possible to measure the transmission margin of the data signal in such a manner that, when the pattern is detected, it can be determined that the falling edge of the clock signal occurs within the transmission window, and, when the pattern is not detected, it can be determined that the falling edge of the clock signal occurs outside the transmission window.

Figure 12:
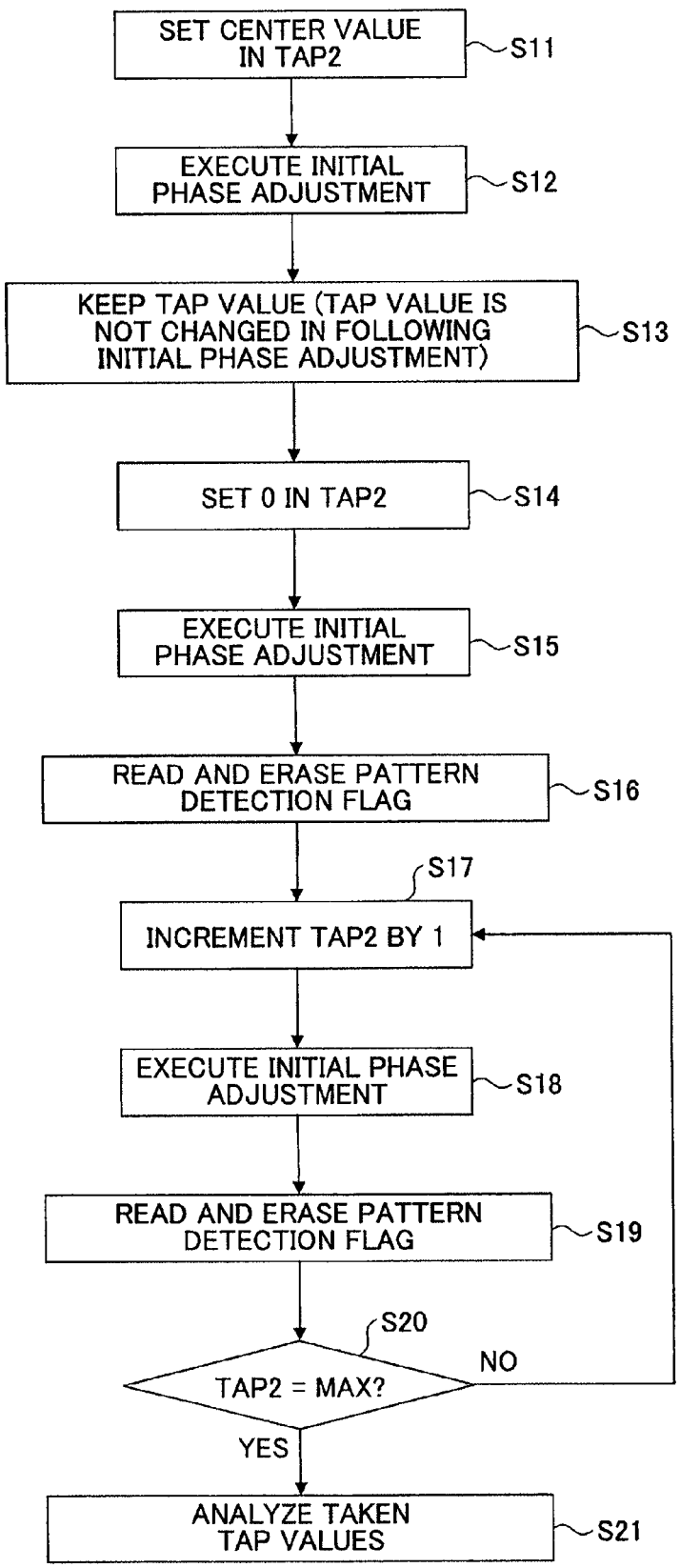
FIG. 12 is an operation flow chart illustrating a procedure of measuring a transmission margin in one embodiment of the present invention.

Specifically, the following procedure is carried out thanks to the function of the firmware 280 of the controller 9:

FIG. 12 shows an operation flow chart of the above-described transmission margin measurement operation in the reception chip 200.

In Step S11, the TAP2 value 51 is set to have the center value, and the initial phase adjustment operation is carried out (Step S12). Then the TAP value 11 thus obtained is held, and also, the TAP value 11 is fixed so that the TAP value 11 is prevented from being automatically updated during the initial phase adjustment operation carried out after then, whereby the phase adjusting function of the phase adjusting circuit 231-*i* is deactivated (Step S13).

Next, the TAP 2 value 51 is set to have 0 (Step S14), and then, the initial phase adjustment operation is carried out (Step S15). However, in this case, since the TAP value 11 is fixed as mentioned above, the delay amount provided by the delay line 30 is not changed. As a result, the thus-fixed delay amount is given to the clock signal provided by the phase amount adding circuit 215, and then, the resulting clock signal is provided to the flip-flop circuit 241-*i*. In the flip-flop circuit 241-*i*, the data of training pattern is taken with the thus-provided clock signal, and, pattern detection is carried out by the pattern detecting circuit 251-*i* based on the thus-taken data. When the pattern detection results in success and thus the pattern detection flag 81 is generated, the pattern detection flag 81 is read, and then, the same is erased (Step S16).

Then, the TAP2 value 51 is incremented by 1 (Step S17), and the initial phase adjustment operation is carried out (Step S18). Also in this case, the delay amount of the delay line 30 of the phase adjusting circuit 213-*i* is not changed. As a result, the thus-fixed delay amount is given to the clock signal provided by the phase amount adding circuit 215, and then, the resulting clock signal is provided to the flip-flop circuit 241-*i*. In the flip-flop circuit 241-*i*, the data of training pattern is taken with the thus-provided clock signal, and, pattern detection is carried out by the pattern detecting circuit 251-*i* based on the thus-taken data. When the pattern detection results in success and thus the pattern detection flag is generated, the pattern detection flag 81 is read, and then, the same is erased (Step S19).

After that, the loop operation of Steps S17 through S20 is repeated until the TAP2 value becomes a maximum value (Yes in Step S20).

After the completion thereof, in Step S21, the pattern detection flags 81 thus read in Steps S16 and S19 are analyzed.

Next, with reference to FIGS. 13 and 14, this transmission margin measurement operation will be described in further detail with an actual operation example.

Figure 13:
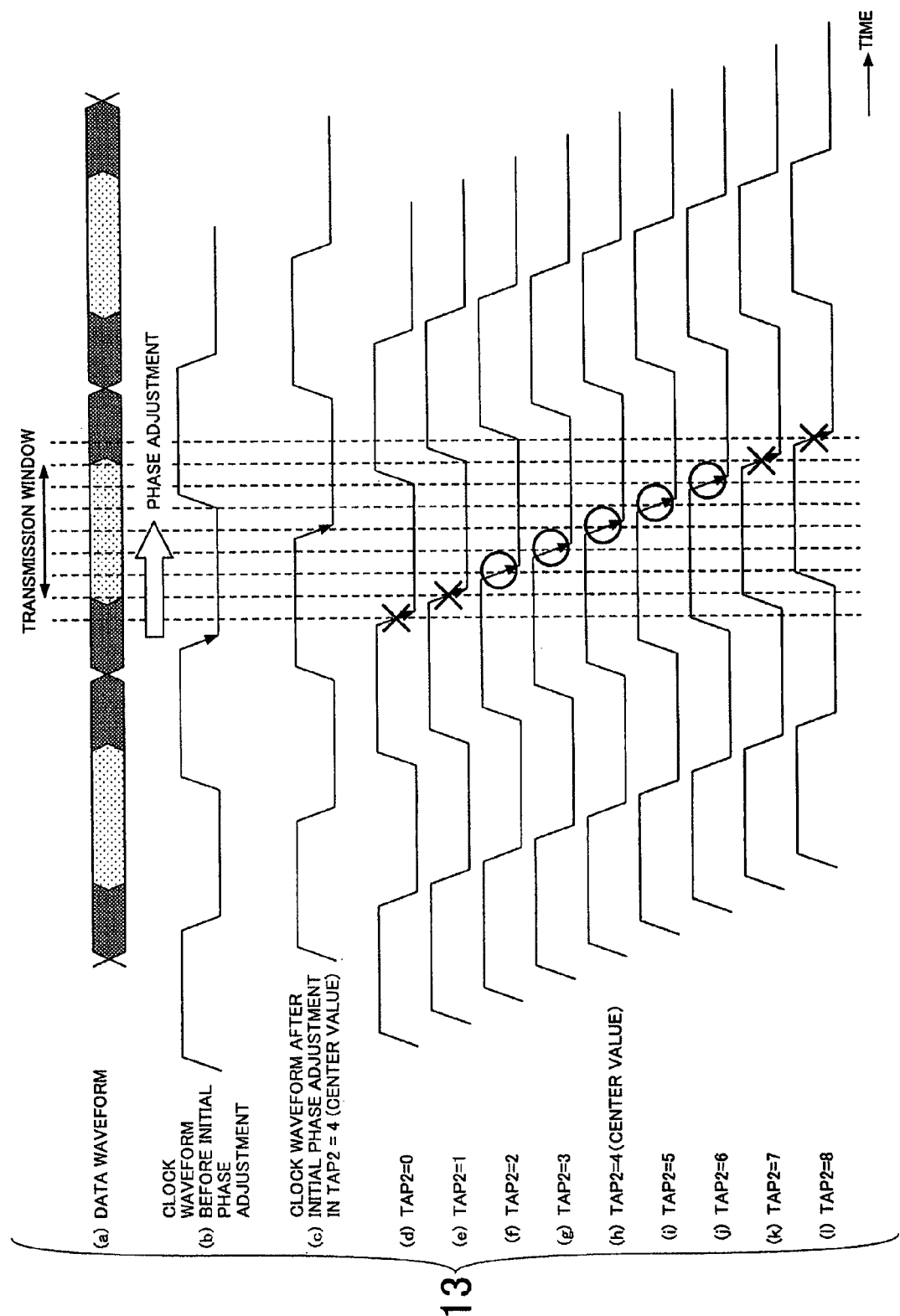
FIG. 13 is a time chart illustrating the example of measuring the transmission margin in the procedure shown in FIG. 12.

FIGS. 13 (*a*) and (*b*) shows a temporal relationship between the data signal waveform and the clock signal waveform before the first phase adjustment operation (Step S12 of FIG. 12) after the TAP2 value 51 is set to have 4 (i.e., the center value) in Step S11. FIG. 13 (*c*) shows the clock signal waveform after the first phase adjustment operation (Step S12). As shown in FIGS. 13 (*a*) and (*c*), by the first phase adjustment operation, the delay amount of the clock signal is adjusted by the phase adjusting circuit 231-*i* in such a manner that the falling edge of the clock signal occurs at the center of the data signal waveform, as in FIGS. 4 (*c*) and (*e*).

It is noted that the above-mentioned 'transmission window' means such a range in the data signal waveform that, as long as the falling edge of the clack signal occurs within the range, the data is properly taken with the falling edge of the clock signal in the flip-flop circuit 241-*i*.

FIGS. 13 (*d*) through (*l*) shows a state in which, as a result of the TAP2 value 51 being incremented in sequence in Steps S14 and S17, the delay amount given to the clock signal by the delay line 60 of the phase amount adding circuit 215 increases accordingly, and as a result, the clock signal gradually delays in sequence. That is, there, the phase of the data of training pattern provided for the initial phase adjustment operation is fixed in the state shown in FIG. 13 (*a*), while, the phase of the clock signal delays in sequence stepwise as a result of the TAP2 value 51 being gradually incremented in Step S14, S17 as mentioned above. Then, after Step S13 in which the phase adjusting function of the phase adjusting circuit 213-*i* is deactivated as mentioned above, the data of training pattern is taken by the flip-flop circuit 241-*i* with the clock signal, which is provided by the phase amount adding circuit 215, and then, has the fixed delay amount given thereto by the phase adjusting circuit 213-*i*.

In the flow chart of FIG. 12, the initial phase adjustment is carried out with the TAP2 value 51 set to have 4 (center value) in Steps S11, S12. As a result, the phase between the clock signal and the data signal is adjusted, and thus, the falling edge of the clock signal occurs at the center of the transmission window (see FIGS. 13 (*a*), (*c*)). Then, as mentioned above, the TAP value 11 at this time is fixed, and thus, is prevented from being automatically updated during the initial phase adjustment operation carried out after that.

In the reception chip 200, the data is taken by the flip-flop circuit 241-*i* with the falling edge of the clock signal, and, when the training pattern of the data is detected in the pattern detecting circuit 251-*i*, the pattern detection flag 81 set in the register of the control part 80 thereof.

When the falling edge of the clock signal occurs within the transmission window, that is, in the case of FIGS. 13 (*f*) through (*j*), the data signal waveform is stabilized at the falling edge of the clock signal. As a result, the data is properly taken by the flip-flop circuit 251-*i* with the falling edge of the clock signal.

On the other hand, when the falling edge of the clock signal occurs outside the transmission window, that is, in the case of FIGS. 13 (*d*), (*e*), (*k*) and (*l*), the data signal waveform is in a transitional state and thus, is not stabilized at the falling edge of the clock signal. As a result, the data is not properly taken by the flip-flop circuit 251-*i* with the falling edge of the clock signal.

Next, the TAP2 value 51 is set to have 0 and the initial phase adjustment operation is carried out (Steps S14, S15 of FIG. 12). At this time, the delay amount of the delay line 30 of the phase adjusting circuit 231-*i* is fixed as mentioned above. After the completion of the initial phase adjustment operation, the pattern detection flag 81, if any, in the register of the control part 80 of the pattern detecting circuit 251-*i*, is read. Then, preparing for the pattern detection flag 81 being written during the subsequent initial phase adjustment operation, this register is cleared (Step S16).

After that, in the same manner, the TAP2 value 51 is changed from 1 through 8 gradually one by one, i.e., it is changed throughout the range of the TAP2 value, and each time when the TAP2 value 51 is incremented, the initial phase adjustment operation is carried out (i.e., repetition of the loop of Steps S17 through S20).

FIG. 14 shows results of the pattern detection flags 81 being thus read.

As shown in FIG. 14, in the case where the TAP2 value 51 has 0, 1, 7 or 8, that is, in the case of FIG. 13 (*d*), (*e*), (*k*) or (*l*), the falling edge of the clock signal occurs outside the transmission window, the data signal cannot be properly received, and thus, the training pattern is not detected.

On the other hand, in the case where the TAP2 value 51 has 2, 3, 4, 5 or 6, that is, in the case of FIGS. 13 (*f*) through (*j*), the falling edge of the clock signal occurs within the transmission window, the data signal can be properly received, and thus, the training pattern is detected.

That is, it can be determined that the range of the TAP2 value 51 of 2 through 6 (i.e., the width of the range of the TAP2 value 51 is 5) corresponds to the transmission window of the data signal. There, by previously measuring a change rate of the delay amount of the phase amount adding circuit 215 for when the TAP2 value 51 changes +1 each, the width of the transmission window of the data can be calculated.

For example, when the change rate of the delay amount of the delay line 60 for when the TAP2 value 51 is changed by +1 each is 100 ps, the actual width of the data transmission window, i.e., the transmission margin can be obtained as 500 ps, as a result of 100 ps being multiplied by the above-mentioned 5, i.e., the width of the range of the TAP2 value 51.

Figure 15:
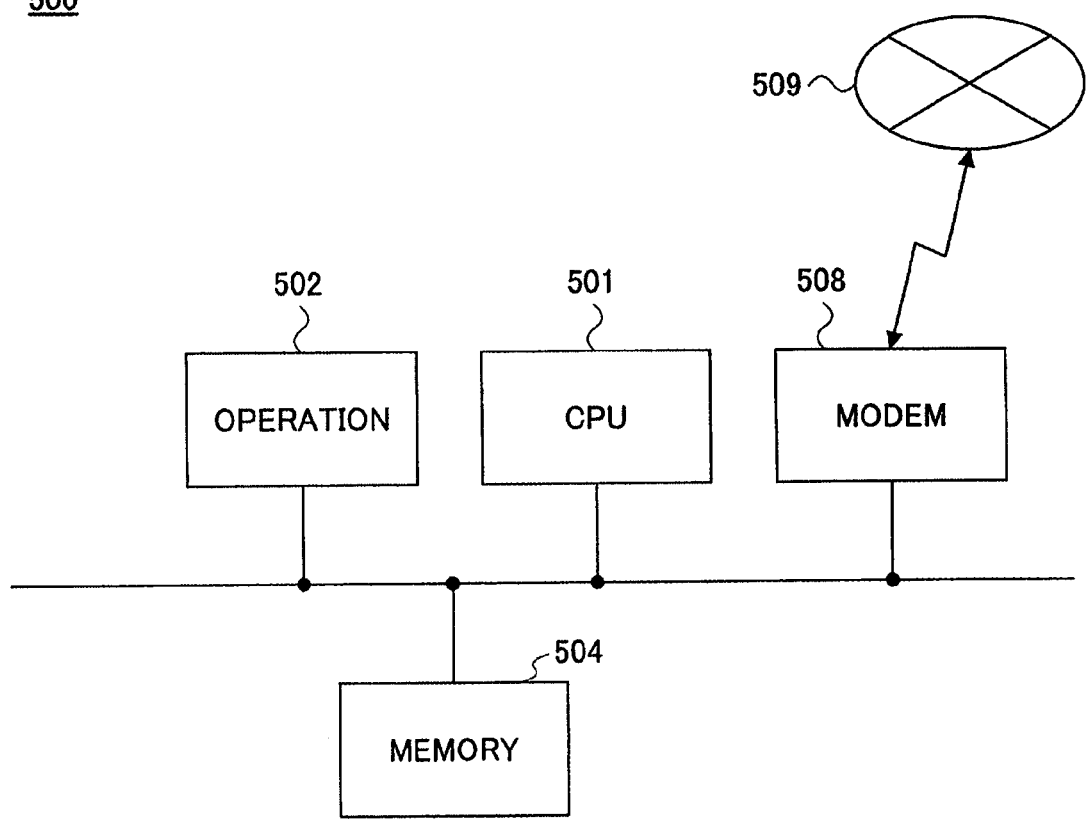
FIG. 15 is a block diagram illustrating an example of a configuration of a computer acting as a controller shown in FIG. 5.

FIG. 15 is a block diagram showing an example of a hardware configuration of a computer configuring the controller 9 provided in the computer system in the above-described embodiment of the present invention.

As shown in FIG. 15, the computer 500 (i.e., the controller 9) has a CPU 501 for carrying out various sorts of operation by executing instructions written in a given program, an operation part 502, a memory 504 for storing a program to be executed by the CPU 501, data and so forth, and a modem 508 for downloading the program from an external server via a communication network 509 such as the Internet, LAN or such.

Further, the memory 504 generally includes a so-called memory (RAM or such) and a non-volatile memory.

The computer 500 acting as the controller 9 is connected to each chip set B of the computer system shown in FIG. 5 directly or via the communication network 509.

In the computer 500, the above-mentioned firmware 280 is stored in the non-volatile memory of the memory 504 when the computer 500 is shipped.

Then, the firmware 280 is loaded in the so-called memory (RAM or such) of the memory 504, the firmware 280 is executed by the CPU 501 and thereby, the operation of proving the phase adjustment operation of the phase adjusting circuit 231-*i* described above with reference to FIG. 9, or the operation of measuring the transmission margin of the data signal described above with reference to FIG. 12, are carried out to the reception chip 200 included in each chip set B of the computer system shown in FIG. 5.

Thus, in the embodiment of the present invention, a configuration is provided such that the phase amount adding circuit 215 is provided in the reception chip 200, and, the TAP value 11 stored in the register of each phase adjusting circuit 231-*i* is readable/writable by the function of the firmware 280 of the controller 9 during operation of the reception chip 200. Thereby, proving the phase adjusting function carried out by the phase adjusting circuit 231-*i* can be automatically carried out simultaneously for all the signals input to the data input circuits 221-1 through 221-*n*. Similarly, measurement of the transmission margin of the data signal can be automatically carried out simultaneously for all the signals input to the data input circuits 221-1 through 221-*n*. Thus, apparatus evaluation and trouble analysis can be very easily carried out, and also, removal of a part having a trouble can be very easily carried out.

While the invention herein disclosed has been described by means of specific embodiments and applications thereof, numerous modifications and variations could be made thereto by those skilled in the art without departing from the scope of the invention set forth in the claims.

The present application is based on Japanese Priority Application No. 2007-014224, filed on Jan. 24, 2007, the entire contents of which are hereby incorporated herein by reference.

What is claimed is:

1. A phase adjusting function evaluating method comprising:

evaluating phase adjusting functions of a plurality of phase adjusting parts provided in a reception apparatus including the plurality of phase adjusting parts provided for respective ones of a plurality of data signals received, each configured to have the phase adjusting function to automatically adjust a phase between the corresponding data signal and a clock signal received together with and individually from the plurality of data signals; and a phase amount adding part configured to add a predetermined phase amount to the clock signal or the plurality of data signals;

changing, in a predetermined manner, by an added phase amount changing part, the predetermined phase amount added by the phase amount adding part to the clock signal or the plurality of data signals; and storing, in a storage, by a storing part an operation result of the phase adjusting function carried out by the phase adjusting part, in response to the predetermined phase amount added to the clock signal or the plurality of data signals by the phase amount adding part being changed by the added phase amount changing part.

2. The phase adjusting function evaluating method as claimed in claim 1, wherein:

the phase adjusting function of each phase adjusting part comprises a function of establishing a predetermined phase relationship between the data signal and the clock signal in such a manner that the data signal can be properly taken with the clock signal, as a result of adjusting the phase between the data signal and the clock signal.

3. The phase adjusting function evaluating method as claimed in claim 2, wherein:

the added phase amount changing part gradually changes in one direction the predetermined phase amount added by the phase amount adding part to the clock signal or the plurality of data signals; and each time the phase amount added to the clock signal or the plurality of data signals is changed by the added phase amount changing part, the storing part stores in the storage information concerning phase adjusting operation upon establishing the predetermined phase relationship between the data signal and the clock signal carried out by each phase adjusting part each time when the added phase amount changing part changes the predetermined phase amount added by the phase amount adding part to the clock signal or the plurality of data signals.

4. A transmission margin measuring method for measuring transmission margins which a plurality of data signals have, in a reception apparatus including a plurality of phase adjusting parts provided for respective ones of the plurality of data signals received, each configured to have a phase adjusting function to automatically adjust a phase between the corresponding data signal and a clock signal received together with the plurality of data signals; and a phase amount adding part configured to add a predetermined phase amount to the clock signal or the plurality of data signals, comprising:

changing, in a predetermined manner, by an added phase amount changing part, the predetermined phase amount added to the clock signal or the plurality of data signals by the phase amount adding part, with deactivation of the phase adjusting function of the phase adjusting part; and each time when the added phase amount changing part changes in the predetermined manner the phase amount added to the clock signal or the plurality of data signals by the phase amount adding part, measuring the transmission margin of the data signal by determining whether the data signal is properly taken with the clock signal.

5. An information processing apparatus, comprising:

a plurality of phase adjusting parts provided for respective ones of a plurality of data signals received, each configured to have a phase adjusting function to automatically adjust a phase between the corresponding data signal and a clock signal received together with the plurality of data signals;

a phase amount adding part configured to add a predetermined phase amount to the clock signal or the plurality of data signals;

an added phase amount changing part configured to change, in a predetermined manner, the predetermined phase amount added by the phase amount adding part to the clock signal or the plurality of data signals; and a storing part configured to store, in a storage, an operation result of the phase adjusting function carried out by the phase adjusting part, in response to the predetermined phase amount added to the clock signal or the plurality of data signals by the phase amount adding part being changed by the added phase amount changing part.

6. The information processing apparatus as claimed in claim 5, wherein:

the phase adjusting function of each phase adjusting part comprises a function of establishing a predetermined phase relationship between the data signal and the clock signal in such a manner that the data signal can be properly taken with the clock signal, as a result of adjusting the phase between the data signal and the clock signal.

7. The information processing apparatus as claimed in claim 6, wherein:

the added phase amount changing part gradually changes in one direction the predetermined phase amount added by the phase amount adding part to the clock signal or the plurality of data signals; and each time the phase amount added to the clock signal or the plurality of data signals is changed by the added phase amount changing part, the storing part stores in the storage information concerning phase adjusting operation upon establishing the predetermined phase relationship between the data signal and the clock signal carried out by each phase adjusting part each time when the added phase amount changing part changes the predetermined phase amount added by the phase amount adding part to the clock signal or the plurality of data signals.

8. An information processing apparatus comprising:

a plurality of phase adjusting parts provided for respective ones of a plurality of data signals received, each configured to have a phase adjusting function to automatically adjust a phase between the corresponding data signal and a clock signal received together with the plurality of data signals;

a phase amount adding part configured to add a predetermined phase amount to the clock signal or the plurality of data signals; and an added phase amount changing part configured to change, in a predetermined manner, the predetermined phase amount added to the clock signal or the plurality of data signals by the phase amount adding part, with deactivation of the phase adjusting function of the phase adjusting part, wherein:

each time when the added phase amount changing part changes in the predetermined manner the phase amount added to the clock signal or the plurality of data signals by the phase amount adding part, a transmission margin of the data signal is measured as a result of it being determined whether the data signal is properly taken with the clock signal.

9. A non-transitory computer readable information recording medium storing therein a program comprising instructions to cause a computer to act as:
   phase adjusting means provided for each of a plurality of data signals received, having a phase adjusting function to automatically adjust a phase between the corresponding data signal and a clock signal received together with the plurality of data signals;
   phase amount adding means for adding a predetermined phase amount to the clock signal or the plurality of data signals;
   added phase amount changing means for changing, in a predetermined manner, the predetermined phase amount added by the phase amount adding means to the clock signal or the plurality of data signals; and
   storing means for storing, in a storage, an operation result of the phase adjusting function carried out by the phase adjusting means, in response to the predetermined phase amount added to the clock signal or the plurality of data signals by the phase amount adding means being changed by the added phase amount changing means.

10. The non-transitory computer readable information recording medium as claimed in claim 9, wherein:
    the phase adjusting function of each phase adjusting means comprises a function of establishing a predetermined phase relationship between the data signal and the clock signal in such a manner that the data signal can be properly taken with the clock signal, as a result of adjusting the phase between the data signal and the clock signal.

11. The non-transitory computer readable information recording medium as claimed in claim 10, wherein:
    the added phase amount changing means gradually changes in one direction the predetermined phase amount added by the phase amount adding means to the clock signal or the plurality of data signals; and
    each time the phase amount added to the clock signal or the plurality of data signals is changed by the added phase amount changing means, the storing means stores in the storage information concerning phase adjusting operation upon establishing the predetermined phase relationship between the data signal and the clock signal carried out by each phase adjusting means each time when the added phase amount changing means changes the predetermined phase amount added by the phase amount adding means to the clock signal or the plurality of data signals.

12. A non-transitory computer readable information recording medium storing therein a program comprising instructions for causing a computer to act as:
    phase adjusting means provided for each of a plurality of data signals received, having a phase adjusting function to automatically adjust a phase between the corresponding data signal and a clock signal received together with the plurality of data signals;
    phase amount adding means for adding a predetermined phase amount to the clock signal or the plurality of data signals;
    added phase amount changing means for changing, in a predetermined manner, the predetermined phase amount added to the clock signal or the plurality of data signals by the phase amount adding means, with deactivation of the phase adjusting function of the phase adjusting means, wherein:
    each time when the added phase amount changing means changes in the predetermined manner the phase amount added to the clock signal or the plurality of data signals by the phase amount adding means, a transmission margin of the data signal is measured as a result of it being determined whether or not the data signal is properly taken with the clock signal.

* * * * *